US008022309B2

(12) United States Patent
Pai et al.

(10) Patent No.: US 8,022,309 B2
(45) Date of Patent: Sep. 20, 2011

(54) FLEXIBLE PRINTED CIRCUIT BOARD

(75) Inventors: Yu-Chang Pai, Taipei Hsien (TW);
Shou-Kuo Hsu, Taipei Hsien (TW);
Chien-Hung Liu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 878 days.

(21) Appl. No.: 11/946,859

(22) Filed: Nov. 29, 2007

(65) Prior Publication Data

US 2009/0044968 A1  Feb. 19, 2009

(30) Foreign Application Priority Data

Aug. 17, 2007 (CN) .......................... 2007 1 0201390

(51) Int. Cl.
*H05K 1/00* (2006.01)
(52) U.S. Cl. ........................................ 174/254; 174/255
(58) Field of Classification Search .................. 174/254, 174/255, 260, 261
See application file for complete search history.

(56) References Cited

U.S. PATENT DOCUMENTS

| | | | | |
|---|---|---|---|---|
| 6,624,729 B2 * | 9/2003 | Wright et al. | ................. | 333/238 |
| 6,797,891 B1 * | 9/2004 | Blair et al. | .................... | 174/268 |
| 7,292,452 B2 * | 11/2007 | Ng et al. | ....................... | 361/780 |
| 2006/0237322 A1 | 10/2006 | Hsu | | |

FOREIGN PATENT DOCUMENTS

| | | |
|---|---|---|
| CN | 1852635 A | 10/2006 |
| TW | 200616501 A | 5/2006 |

* cited by examiner

*Primary Examiner* — Ishwarbhai Patel
(74) *Attorney, Agent, or Firm* — Altis Law Group, Inc.

(57) ABSTRACT

An exemplary FPCB includes a signal layer having a differential pair consisting of two transmission lines arranged therein, a ground layer, and a dielectric layer lying between the signal layer and the ground layer. Two sheets made of conductive materials are respectively arranged at opposite sides of the differential pair, and both connected to ground. The sheets are apart from and parallel to the transmission lines. The ground layer has a void defined therein, and the void is located under the two transmission lines.

6 Claims, 2 Drawing Sheets

FLEXIBLE PRINTED CIRCUIT BOARD

BACKGROUND

1. Field of the Invention

The present invention relates to a flexible printed circuit board (FPCB), and particularly to a FPCB for transmitting high speed signals.

2. Description of Related Art

FPCBs are light, soft, thin, small, ductile, flexible and support high wiring density. FPCBs can be three-dimensionally wired and shaped according to space limitations. Flexible circuits are typically useful for electronic packages where flexibility, weight control and the like are important.

Referring to FIG. 2, a conventional FPCB includes a signal layer and a ground layer 50, a differential pair 51 consisting of two transmission lines 52 and 54 is arranged in the signal layer, the ground layer is formed vertically beneath the signal layer and etched in a grid array. The layout in the ground layer 50 vertically beneath the transmission line 52 is different from that beneath the transmission line 54, noise is easily generated, which prevents the FPCB transmitting high speed signals.

What is needed, therefore, is a FPCB which can transmit high speed signals.

SUMMARY

An exemplary FPCB includes a signal layer having a differential pair consisting of two transmission lines arranged therein, a ground layer, and a dielectric layer lying between the signal layer and the ground layer. Two sheets made of conductive materials are respectively arranged at opposite sides of the differential pair, and both connected to ground. The sheets are apart from and parallel to the transmission lines. The ground layer has a void defined therein, and the void is located under the two transmission lines.

Other advantages and novel features will become more apparent from the following detailed description when taken in conjunction with the accompanying drawings, in which:

DETAILED DESCRIPTION

Figure 1:
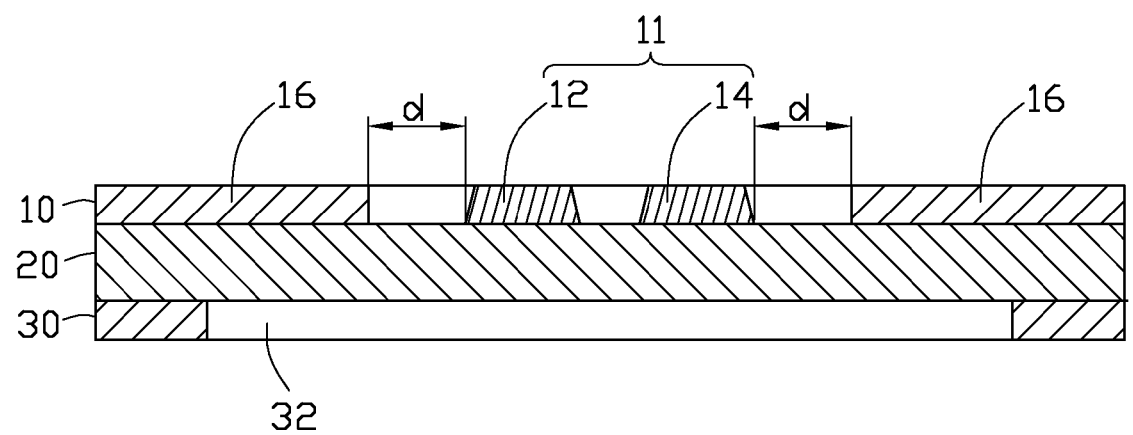
FIG. 1 is a cross-sectional view of an FPCB according to an embodiment of the present invention.

Referring to FIG. 1, an FPCB in accordance with an embodiment of the present invention includes a signal layer 10, a ground layer 30, and a dielectric layer 20 lying between the signal layer 10 and the ground layer 30. A differential pair 11 consisting of two transmission lines 12, 14 is arranged in the signal layer 10. A void 32 is defined in the ground layer 30 under the two transmission lines 12 and 14. Thus, a low characteristic impedance problem of the transmission lines 12 and 14, which is caused by a distance between the differential pair 11 and the ground layer 30 being too short, is avoided. Two sheets 16 made of conductive materials, such as copper, are respectively arranged at opposite sides of the differential pair 11 and parallel to the transmission lines 12 and 14, the two sheets 16 are both coupled to ground. There is a distance d between each sheet 16 and its nearest transmission line 12, 14.

The length of the distance d is obtained by simulating the FPCB of FIG. 1 in a conventional simulation software, simulating the signal type to be transmitted through the transmission lines 12 and 14 and the desired impedance of the transmission line, and adjusting the distance d and the width of the void 32, until desired characteristic impedances of the transmission lines 12 and 14 are achieved. The distance d is also affected by the following factors: the width of each transmission line 12, 14; a distance between the transmission line 12 and 14; widths of the sheets 16; and the height of the dielectric layer 20. Generally, when the signal transmission lines 12 and 14 transmit IEEE 1394 signals, the length of the distance d should be 40 mils; when the signal transmission lines 12 and 14 transmit PCI-EXPRESS signals, the length of the distance d should be 10 mils; when the signal transmission lines 12 and 14 transmit USB signals, the length of the distance d should be 4 mils.

Figure 2:
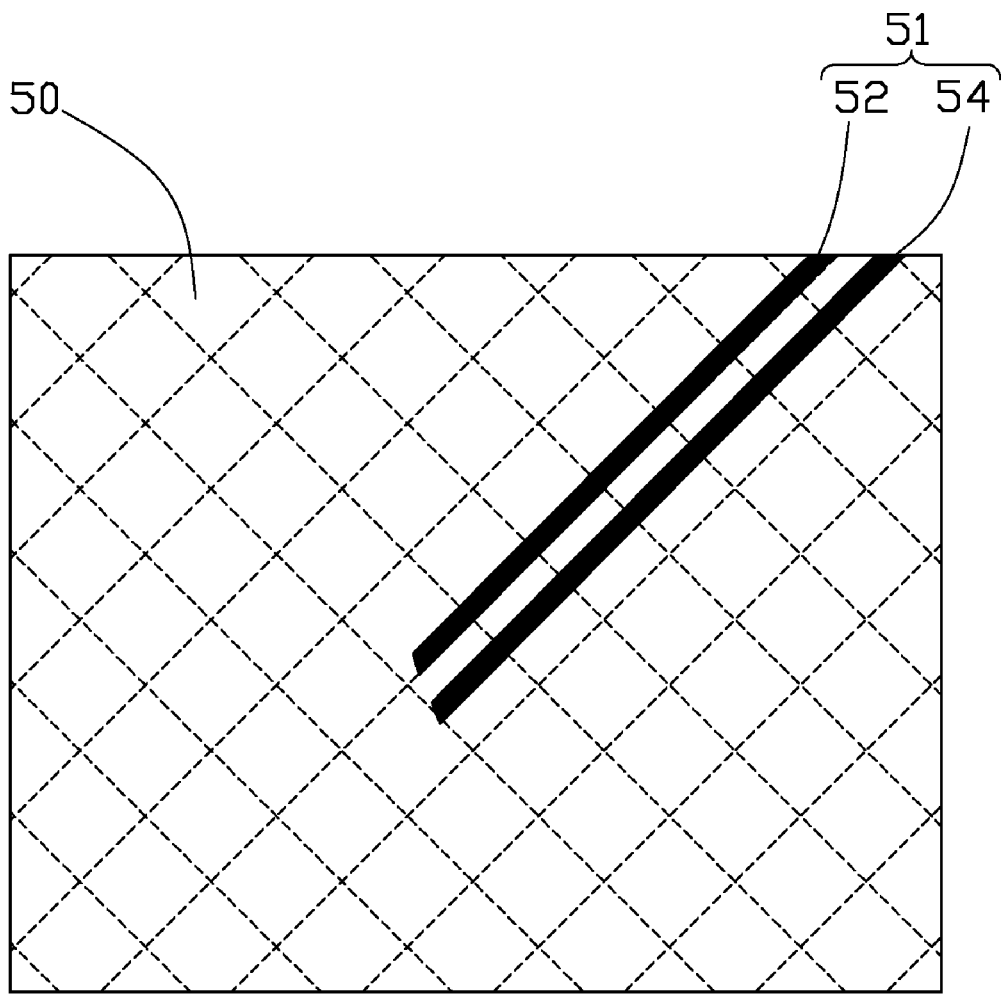
FIG. 2 is a schematic diagram of a conventional FPCB.

The layout of ground layer beneath the transmission line 12 and 14 are the same, and the noise caused by the grid array construction of the ground layer in FIG. 2 is reduced, and the impedance of the transmission line is matched, so the FPCB of the embodiment of the present invention can transmit high speed signals. No new manufacturing steps are added to make the FPCB of the present invention, only changes in designing the layout the FPCB is needed, so the FPCB of the present invention has low noise, low cost, and can transmit high speed signals.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A flexible printed circuit board (FPCB), comprising:
   a signal layer having a differential pair consisting of two transmission lines arranged therein, and two grounded sheets made of conductive materials respectively arranged at opposite sides of the differential pair, the sheets being apart from and parallel to the transmission lines;
   a ground layer having a void defined therein, the void located under the two transmission lines; and
   a dielectric layer lying between the signal layer and the ground layer.

2. The FPCB as claimed in claim 1, wherein the length of the distance between the sheets and the transmission lines is 40 mils.

3. The FPCB as claimed in claim 1, wherein the length of the distance between the sheets and the transmission lines is 10 mils.

4. The FPCB as claimed in claim 1, wherein the length of the distance between the sheets and the transmission lines is 4 mils.

5. The FPCB as claimed in claim 1, wherein the sheets are made of copper.

6. The FPCB as claimed in claim 1, wherein each sheet has the same length as the transmission lines.

* * * * *